United States Patent [19]

Levinson et al.

[11] Patent Number: 5,111,254

[45] Date of Patent: May 5, 1992

[54] FLOATING GATE ARRAY TRANSISTORS

[75] Inventors: Mark Levinson, Sudbury; Brian M. Ditchek, Milford; Philip G. Rossoni, Belmont; Frederick Rock, Marlboro, all of Mass.

[73] Assignee: GTE Laboratories Incorporated, Waltham, Mass.

[21] Appl. No.: 569,355

[22] Filed: Aug. 17, 1990

[51] Int. Cl.[5] .................. H01L 29/80; H01L 29/48
[52] U.S. Cl. ........................................ 357/22; 357/15
[58] Field of Search ........................... 357/22, 15, 68

[56] References Cited

U.S. PATENT DOCUMENTS

| | | | |
|---|---|---|---|
| 3,267,405 | 8/1966 | Weiss et al. | 338/32 |
| 4,249,190 | 2/1981 | Cho | 357/22 |
| 4,482,907 | 11/1984 | Jay | 357/22 |
| 4,829,173 | 5/1989 | Ditchek et al. | 250/211 |

OTHER PUBLICATIONS

B. M. Ditchek et al., "Semiconductor-Metal Eutectic Composites for High-Power Switching", SPIE vol. 871 Space Struc., Power, and Power Conditioning (1988) pp. 148-152.
B. M. Ditchek et al., "Microcharacterization and Novel Device Applications of Semiconductor-Metal Eutectic Composites" vol. 27, No. 11, Nov. 1988, pp. L2155-2157, Japanese Jour. of Appl. Phys.
B. M. Ditchek et al., "Novel High Voltage Transistor Using the In Situ Junctions in a SiTaSi$_2$ Eutectic Composite", Appl. Phys. Lett 52 (14) Apr. 1988, Amer. Inst. of Physics, pp. 1147-1149.
Y. C. Kao et al., "High-Voltage Planar p-n Junctions", Proc. of the IEEE, vol. 55, No. 8, Aug. 1967, pp. 1409-1414.

Primary Examiner—Mark Prenty
Attorney, Agent, or Firm—Victor F. Lohmann, III

[57] ABSTRACT

A junction field effect transistor having an array of electrically floating gate elements located between the control gate and the drain in the path of current flow from the source to the drain. As the drain voltage increases the depletion zone of the control gate expands until it reaches the nearest floating gate. The maximum electric field at the control gate is clamped while the nearest floating gate increases in potential and its depletion zone expands toward the next floating gate, and so on. In this way the applied voltage is spread over the array of floating gates clamping the maximum electric field at a value that is less than the avalanche breakdown field. Then, the avalanche breakdown voltage of the device is increased.

10 Claims, 2 Drawing Sheets

FLOATING GATE ARRAY TRANSISTORS

This invention was made with Government support under Contract N00014-86-C-0595 awarded by the Department of the Navy. The Government has certain rights in the invention.

BACKGROUND OF THE INVENTION

This invention relates to semiconductor devices. More particularly, it is concerned with junction field effect transistors.

The principal limitation of the maximum voltage capability in transistors is the mechanism of avalanche breakdown. Avalanche breakdown occurs when mobile electrons or holes in the semiconductor material are accelerated by an electric field which is sufficiently large that they gain a quantity of energy greater than the semiconductor bandgap before being scattered by other electrons or the lattice. In a scattering event with a valence band electron, the amount of energy is sufficient to raise the valence electron to the conduction band and thereby create an electron-hole pair. Each of these new charge carriers can themselves gain energy from the electric field and in turn create still more electron-hole pairs. In this way the current increases in an extremely short time to a point that is limited only by the series resistance of the circuit. In many instances the energy dissipated in the semiconductor by such large currents may be sufficient to cause thermal runaway and destruction of the device.

In semiconductor devices internal electric fields are found in the depletion regions of rectifying junctions, which may be either p-n, metal-semiconductor (Schottky), or metal-insulator-semiconductor. The electric field $E_{max}$ at which avalanche breakdown occurs is determined by ionization coefficients of electrons and holes which are specific to each semiconductor material. Given $E_{max}$, the corresponding maximum voltage $V_{max}$ which can be supported without avalanche breakdown can be expressed for planar junctions as $$V_{max} = (E_{max}^2 e_s / 2qN_d) - V_b,$$

where $e_s$ is the semiconductor permittivity, q is the electronic charge, $N_d$ is the net dopant concentration, and $V_b$ is the built-in junction potential, which will normally be negligible compared to $V_{max}$.

Because $V_{max}$ is inversely proportional to $N_d$, it is clear that achieving a high breakdown voltage requires a low carrier concentration. However, a low carrier concentration means high resistivity, and so limits the current densities which can be transported without unacceptable heating. Therefore, conventional transistor technology permits either high carrier concentration, high current density devices operating at low voltage, or low carrier concentration, low current devices operating at high voltage, but not high current density, high voltage devices. Conventional high power transistors are made with low carrier concentration material but must use large junction areas in order to pass large currents. However, their substantial series resistance results in significant power dissipation, and together with the large capacitance due to the large junction area and minority carrier storage and transit time effects, limits their frequency response.

SUMMARY OF THE INVENTION

An improved junction field effect transistor in accordance with the present invention comprises a body including a layer of active semiconductor material and an underlying insulating or semi-insulating substrate with the layer having a surface. A source electrode is in ohmic contact with the semiconductor material and has a source contact member at the surface. A drain electrode is in ohmic contact with the semiconductor material and has a drain contact member at the surface. A control gate electrode is in rectifying contact with the semiconductor material and is located between the source electrode and the drain electrode for controlling the flow of current between the source electrode and the drain electrode. The control gate electrode has a control gate contact member at the surface between the source contact member and the drain contact member. The transistor includes a floating gate element in rectifying contact with the semiconductor material and electrically isolated from the control gate electrode. The floating gate element is located between the control gate electrode and the drain electrode and between the surface and the interface of the layer of active semiconductor material and the substrate in the path of current flow between the source electrode and the drain electrode. The control gate depletion zone of the control gate electrode expands with increasing drain potential until the control gate depletion zone reaches the floating gate element causing the maximum electric field at the control gate electrode to be clamped while the floating gate element increases in potential as its depletion zone expands.

A junction field effect transistor in accordance with another aspect of the present invention comprises a body including a layer of active semiconductor material and an underlying insulating or semi-insulating substrate with said layer having a surface. A source contact member is in ohmic contact with the semiconductor material at the surface and a drain contact member is in ohmic contact with the semiconductor material at the surface. A control gate contact member is in rectifying contact with the semiconductor material at the surface and is located between the source contact member and the drain contact member for controlling the flow of current between the source contact member and the drain contact member. The device also includes a floating gate element in rectifying contact with the semiconductor material and electrically isolated from the control gate contact member. The floating gate element is located between the control gate contact member and the drain contact member in the path of current flow between the source contact member and the drain contact member. The control gate depletion zone of the control gate contact member expands with increasing drain potential until the control gate depletion zone reaches the floating gate element causing the maximum electric field at the control gate contact member to be clamped while the floating gate element increases in potential as its depletion zone expands.

A junction field effect transistor in accordance with another aspect of the invention comprises a body of semiconductor material including a substrate of relatively low resistivity and an overlying layer of relatively high resistivity having a surface. A plurality of source regions are inset in the layer at the surface. A plurality of control gate regions are inset in the layer at the surface, with the control gate regions alternating with the source regions. A source contact member is an ohmic contact with each of the source regions at the surface, and a control gate contact member is an ohmic contact with each of the control gate regions at the surface. A drain contact member is an ohmic contact with the substrate. The device also includes a plurality of floating gate elements, each in rectifying contact with the semiconductor material of the layer and electrically isolated from the control gate regions and from each other. The floating gate elements are located in the paths of current flow between source regions and the drain contact member. The control gate depletion zones of the control gate regions expand with increasing drain potential until the control gate depletion zones reach the nearest floating gate elements causing the maximum electric fields at the control gate regions to be clamped while the nearest floating gate elements rise in potential as their depletion zones expand.

In the figures the various elements are not drawn to scale.

For a better understanding of the present invention, together with other and further objects, advantages, and capabilities thereof, reference is made to the following discussion and appended claims in connection with the above described drawings.

DETAILED DESCRIPTION

Figure 1:
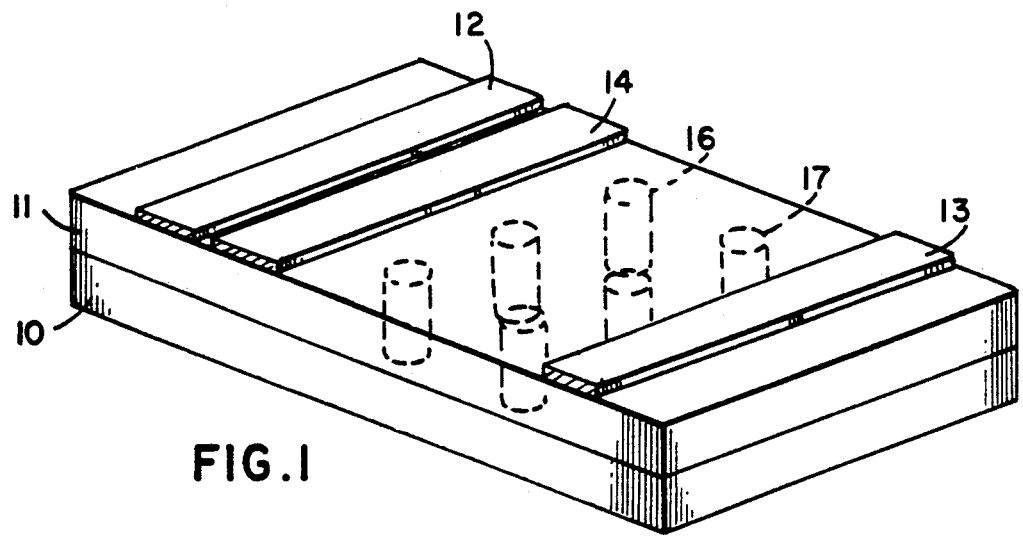
FIG. 1 is a representation in cross section of a junction field effect transistor in accordance with the present invention.

FIG. 1 illustrates a field effect transistor which includes a substrate 10 of insulating or semi-insulating material having deposited thereon a layer 11 of active semiconductor material of appropriate conductivity and resistivity. A source contact member 12 of suitable metallization is in ohmic contact with the surface of the active layer 11. Spaced from the source contact member 12 is a drain contact member 13 also making ohmic contact to the surface of the active semiconductor layer 11. A control gate member 14 located on the surface between the source contact member 12 and drain contact member 13 makes rectifying contact to the active semiconductor layer 11. Alternatively, the control gate member may make ohmic contact to a gate region of the opposite conductivity type inset in the layer 11. The gate control structure provides for controlling the flow of current between the source 12 and drain 13 as is well understood in the operation of junction field effect transistors. In the device as illustrated the source, drain, and gate control members 12, 13, and 14 are all elongated parallel strips.

In accordance with the present invention a plurality or array of floating gate elements 16 and 17 are provided within the active layer 11. In FIG. 1 the gate elements are shown as rods extending from the surface to the interface of the active layer and the substrate 10. The floating gate elements are in rectifying contact with the active semiconductor material of the layer 11 and are electrically isolated from the source, drain, gate, and each other. Under operating conditions they are not connected to external circuitry. The rectifying junctions between the elements 16, 17 and the semiconductor material may be p-n junctions of similar semiconductor material, a metal barrier or Schottky junction, or a heterojunction of different semiconductor materials. In any event the array of floating gate elements 16, 17 are located in the path of current flow between the source 12 and drain 13 as controlled by the control gate 14.

Under operating conditions of the device the potential at the junctions of the floating gate elements 16, 17 with the active semiconductor material 11 floats in such a way as to spread the applied voltage over a greater distance than the depletion width of a single junction. In conventional devices without floating gate arrays the maximum electric field increases parabolically with increasing drain voltage. With floating gates 16, 17 the depletion zone at the control gate 14 expands with increasing drain voltage as in the conventional case, but only until the depletion zone of the control gate intersects the depletion zone of the nearest floating gate elements 16. The junctions of these elements 16 then float in potential with further increases in applied drain voltage so that their depletion zones expand toward the floating gates 17 in the next row, or next nearest to them. The electric field at the control gate reaches a maximum and is clamped at this value. Eventually, a similar maximum field is attained at the first floating gate or gates 16 and so on through the series of floating gates depending upon their physical arrangement between the control gate electrode 14 and the drain 13. In this way the applied voltage is spread across several successive floating gates or sets of floating gates of the array.

The actual values of maximum field depend upon the geometry of the device and the carrier concentration of the semiconductor material. The device is designed so that the applied voltage is spread over the array of floating elements in such a way that the breakdown voltage is greater than that which would occur without the array. That is, the maximum electric field is clamped at a value which is less than the avalanche breakdown field. Thus, even though the drain voltage is increased to a level significantly beyond that required to yield avalanche breakdown in a conventional device, breakdown is suppressed because the field never reaches a value sufficient to cause impact ionization. However, avalanche will eventually occur by a "punch through" mechanism when the depletion region expands to reach the drain contact and no additional floating gates are available to accommodate further voltage increases.

Figure 2:
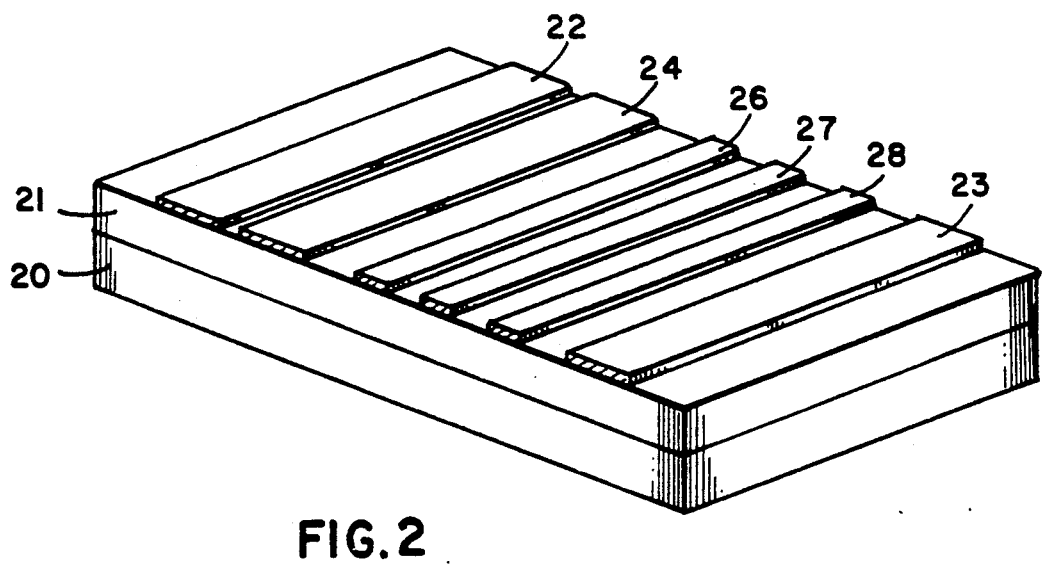
FIG. 2 is a representation in cross section of another form of junction field effect transistor in accordance with the present invention.

FIG. 2 illustrates a form of a junction field effect transistor incorporating a different array of floating gate elements. The device includes an insulating or semi-insulating substrate 20 with an overlying layer of active semiconductor material 21. Source 22, drain 23, and control gate 24 contact member are arranged on the surface similar to the construction described above with respect to FIG. 1. In the device of FIG. 2 the floating gates 26, 27, and 28 are three conductive elongated strips disposed parallel to the source, drain, and control gate members. Each floating gate makes rectifying contact to the active semiconductor layer either by metal-semiconductor rectifying contact or by ohmic contact to an inset region of different conductivity type. The floating gates 26, 27, and 28 are electrically isolated from each other and from the source, drain, and control gate members and from the external circuitry.

The floating gate elements 26, 27, and 28 function in a manner similar to the floating gates 16 and 17 of FIG. 1. As the drain voltage increases the depletion zone at the control gate 24 expands. When the depletion zone reaches the first floating gate element 26, the maximum electric field at the control gate 24 is clamped while that of the floating gate 26 expands as it increases in potential until its depletion zone reaches the next floating gate element 27, and so on. Again, the maximum electric field at which the gates are clamped is less than the avalanche breakdown field.

As a specific example, a GaAs field effect transistor similar to that illustrated in FIG. 2 has a carrier concentration of $n = 1 \times 10^{17} cm^3$. The channel depth (thickness of the active layer 21) is 0.3 microns. The gates are recessed 0.1 microns in order further to reduce the maximum electric field and delay breakdowns. The length of each gate along the direction from source to drain is 0.3 microns, and the separation between gates is 0.2 microns or less. With 0.2 micron spacing it is calculated that each floating gate will add approximately 6.5 volts to the breakdown voltage.

Figure 3:
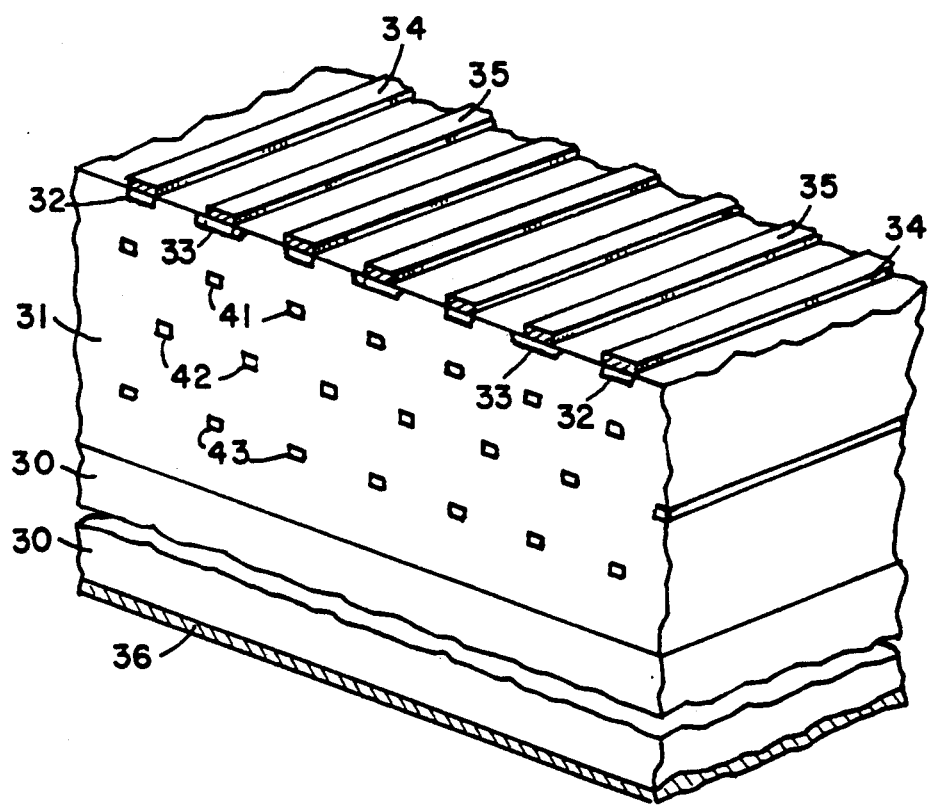
FIG. 3 is a representation in cross-section of a fragment of a vertical junction field effect transistor in accordance with the present invention.

FIG. 3 illustrates a fragment of a vertical junction field effect transistor in accordance with the present invention. The device includes a substrate 30 of semiconductor material, typically silicon, having an active epitaxial layer 31 of appropriate conductivity type and resistivity which is grown on the substrate 30. Inset at the surface of the active layer 31 are an arrangement of elongated, parallel source regions 32 of the same conductivity type as the active layer 31 but of lower resistivity. Alternating with the source regions 32 are gate regions 33 of the opposite conductivity type also inset in the layer 31 and arranged in a pattern of elongated parallel elements. Source contact members 34 are in ohmic contact with the source regions 32 and are connected together in a manner not shown to form a common source connection. Similarly, metallic contact members 35 are in ohmic contact with the gate regions 33 and are appropriately connected together in an arrangement not illustrated to form a common gate connection. A drain contact member is provided by metallization 36 across the bottom surface of the substrate 30.

In accordance with the present invention the vertical field effect transistor of FIG. 3 includes an array of floating gate elements established generally in rows 41, 42, and 43 although a fully random arrangement is also possible. The rows of floating gate elements 41, 42, and 43 may be fabricated within the active layer 31 by interrupting the conventional epitaxial deposition process to appropriately mask and introduce doping materials in predetermined regions.

As is well understood in the device of FIG. 3 the gate control biasing conditions control the flow of current from the source regions 32 to the drain 36. The floating gate elements operate in the manner similar to that as explained previously with respect to the devices of FIGS. 1 and 2, and thus serve to limit the avalanche breakdown of the device.

In the three devices as illustrated the addition of floating gate elements in the path of current flow beyond the control gate serves to limit the avalanche breakdown of the device thus permitting transistors to operate at higher power in smaller sizes than conventional device structures. The floating gate elements may be any members disposed within the semiconductor material which form rectifying junctions with the semiconductor material and not are not connected to the external circuitry. The junctions may be p-n junctions in which the floating gate elements are of the same semiconductor material as the active layer, metal-semiconductor junctions to provide Schottky rectifying barriers, and heterojunctions in which two different types of semiconductor material are present.

In the foregoing discussion the floating gate elements are described as being continuous or rod-shaped. However, because they are electrically floating and it is unnecessary for the individual elements to intersect a surface in order to be contacted, the array may be a three-dimensional arrangement of spherical or cubic elements. In fact, a three-dimensional array could provide advantages such as higher current density or lower series resistance while still maintaining the breakdown inhibiting effect. The array of floating gate elements could be a uniform or quasi-random arrangement of the elements either at a surface or otherwise within the channel region such as an array of dots on the surface or spheres or cylinders within the channel region, so long as they form rectifying junctions with the active semiconductor material.

While there has been shown and described what are considered preferred embodiments of the present invention, it will be obvious to those skilled in the art that various changes and modifications may be made therein without departing from the invention as defined by the appended claims.

What is claimed is:

1. A junction field effect transistor comprising
    a body including a layer of active semiconductor material and an underlying insulating or semi-insulating substrate, said layer having a surface;
    a source electrode in ohmic contact with the semiconductor material;
    a drain electrode in ohmic contact with the semiconductor material;
    a control gate electrode in rectifying contact with the semiconductor material and having a control gate depletion zone associated therewith; said control gate electrode being located between the source electrode and the drain electrode for controlling the flow of current between the source electrode and the drain electrode;
    said source, drain, and control gate electrodes comprising elongated strips positioned parallel to each other at said surface; and
    a floating gate element in rectifying contact with the semiconductor material and electrically isolated from the control gate electrode; said floating gate element having a floating gate depletion zone associated therewith and being located between the control gate electrode and the drain electrode and between said surface and the interface of the layer of active semiconductor material and the substrate in the path of current flow between the source electrode and the drain electrode;
    such that the control gate depletion zone associated with the control gate electrode expands with increasing drain potential until the control gate depletion zone reaches the floating gate element causing the maximum electric field at the control gate electrode to be clamped while said floating gate element increases in potential as the depletion zone associated therewith expands.

2. A junction field effect transistor in accordance with claim 1 wherein
the maximum electric field at which the control gate electrode is clamped is less than the electric field which would cause avalanche breakdown of the semiconductor material.

3. A junction field effect transistor comprising
a body including a layer of active semiconductor material and an underlying insulating or semi-insulating substrate, said layer having a surface;
a source electrode in ohmic contact with the semiconductor material;
a drain electrode in ohmic contact with the semiconductor material;
a control gate electrode in rectifying contact with the semiconductor material and having a control gate depletion zone associated therewith; said control gate electrode being located between the source electrode and the drain electrode for controlling the flow of current between the source electrode and the drain electrode;
said source, drain, and control gate electrodes comprising elongated strips positioned parallel to each other at said surface; and
a plurality of floating gate elements, each in rectifying contact with the semiconductor material and electrically isolated from the control gate electrode and each other, each of said floating gate elements having a floating gate depletion zone associated therewith, said floating gate elements being located between the control gate electrode and the drain electrode and between said surface and the interface of the layer of active semiconductor material and the substrate in the path of current flow between the source electrode and the drain electrode;
such that the control gate depletion zone associated with the control gate electrode expands with increasing drain potential until the control gate depletion zone reaches one of the floating gate elements causing the maximum electric field at the control gate electrode to be clamped while said one floating gate element increases in potential as the depletion zone associated therewith expands.

4. A junction field effect transistor in accordance with claim 3 wherein
said floating gate elements are elongated, parallel, members extending generally perpendicular to said surface.

5. A junction field effect transistor comprising
a body including a layer of active semiconductor material and an underlying insulating or semi-insulating substrate, said layer having a surface;
a source contact member in ohmic contact with the semiconductor material at said surface;
a drain contact member in ohmic contact with the semiconductor material at said surface;
a control gate contact member in rectifying contact with the semiconductor material at the surface and having a control gate depletion zone associated therewith; said control gate contact member being located between the source contact member and the drain contact member for controlling the flow of current between the source contact member and the drain contact member;
said source, drain, and control gate contact members being elongated strips positioned parallel to each other at said surface; and a floating gate element in rectifying contact with the semiconductor material and electrically isolated from the control gate contact member; said floating gate element having a floating gate depletion zone associated therewith and being located between the control gate contact member and the drain contact member in the path of current flow between the source contact member and the drain contact member;
such that the control gate depletion zone associated with the control gate contact member expands with increasing drain potential until the control gate depletion zone reaches the floating gate element causing the maximum electric field at the control gate contact member to be clamped while said floating gate element increases in potential as the depletion zone associated therewith expands.

6. A junction field effect transistor in accordance with claim 5 wherein
the maximum electric field at which the control gate is clamped is less than the electric field which would cause avalanche breakdown of the semiconductor material.

7. A junction field effect transistor comprising
a body including a layer of active semiconductor material and an underlying insulating or semi-insulating substrate, said layer having a surface;
a source contact member in ohmic contact with the semiconductor material at said surface;
a drain contact member in ohmic contact with the semiconductor material at said surface;
a control gate contact member in rectifying contact with the semiconductor material at the surface and having a control gate depletion zone associated therewith; said control gate contact member being located between the source contact member and the drain contact member for controlling the flow of current between the source contact member and the drain contact member;
said source, drain, and control gate contact members being elongated strips positioned parallel to each other at said surface; and
a plurality of floating gate elements, each in rectifying contact with the semiconductor material and electrically isolated from the control gate contact member and each other, each of said floating gate elements having a floating gate depletion zone associated therewith, said floating gate elements being located between the control gate contact member and the drain contact member in the path of current flow between the source contact member and the drain contact member; one of the floating gate elements being located nearer to the control gate contact member than are other of the floating gate elements;
such that the control gate depletion zone associated with the control gate contact member expands with increasing drain potential until the control gate depletion zone reaches said one floating gate element causing the maximum electric field at the control gate contact member to be clamped while said one floating gate element increases in potential as the depletion zone associated therewith expands toward another of the floating gate elements.

8. A junction field effect transistor in accordance with claim 7 wherein
said floating gate elements are each elongated strips at said surface positioned parallel to each other and to said source, drain, and control gate contact members.

9. A junction field effect transistor in accordance with claim 3 wherein
the maximum electric field at which the control gate electrode is clamped is less than the electric field which would cause avalanche breakdown of the semiconductor material.

10. A junction field effect transistor in accordance with claim 7 wherein
the maximum electric field at which the control gate is clamped is less than the electric field which would cause avalanche breakdown of the semiconductor material.

* * * * *